(12) United States Patent
Li et al.

(10) Patent No.: US 12,191,217 B2
(45) Date of Patent: Jan. 7, 2025

(54) MOTHERBOARD AND MANUFACTURING METHOD FOR MOTHERBOARD

(71) Applicants: HEFEI BOE JOINT TECHNOLOGY CO., LTD., Hefei (CN); BOE TECHNOLOGY GROUP CO., LTD., Beijing (CN)

(72) Inventors: Yongqian Li, Beijing (CN); Can Yuan, Beijing (CN); Meng Li, Beijing (CN); Xuehuan Feng, Beijing (CN); Zhongyuan Wu, Beijing (CN); Zhidong Yuan, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 640 days.

(21) Appl. No.: 17/435,098

(22) PCT Filed: Feb. 27, 2020

(86) PCT No.: PCT/CN2020/076944
§ 371 (c)(1),
(2) Date: Aug. 31, 2021

(87) PCT Pub. No.: WO2021/168730
PCT Pub. Date: Sep. 2, 2021

(65) Prior Publication Data
US 2022/0344224 A1  Oct. 27, 2022

(51) Int. Cl.
*H01L 21/66* (2006.01)
*H01L 27/02* (2006.01)
*H01L 27/12* (2006.01)
(52) U.S. Cl.
CPC .............. *H01L 22/32* (2013.01); *H01L 27/02* (2013.01); *H01L 27/0288* (2013.01);
(Continued)

(58) Field of Classification Search
CPC ... H01L 27/02; H01L 27/1225; H01L 27/127; H01L 27/124; H01L 27/0296;
(Continued)

(56) References Cited

U.S. PATENT DOCUMENTS 5,650,834 A * 7/1997 Nakagawa ........ G02F 1/136204
349/147
5,652,632 A    7/1997 Shimizu
(Continued)

FOREIGN PATENT DOCUMENTS

CN        1980519 A     6/2007
CN      109427273 A     3/2019
(Continued)

OTHER PUBLICATIONS

Extended European Search Report mailed Mar. 20, 2023 in application No. 20921617.5.

*Primary Examiner* — Michael M Trinh
(74) *Attorney, Agent, or Firm* — Dilworth & Barrese, LLP.; Michael J. Musella, Esq.

(57) ABSTRACT

The present disclosure provides a motherboard and a manufacturing method for the motherboard, the motherboard includes at least one display area, a periphery area surrounding the at least one display area, a plurality of test terminals, an electrostatic discharge line, a plurality of resistors and at least one thin film transistor. The plurality of test terminals are respectively electrically connected to the electrostatic discharge line through the plurality of resistors. At least one of the plurality of resistors includes an inorganic nonmetal trace. The at least one thin film transistor includes an active layer, and the inorganic nonmetal trace includes a same semiconductor matrix material as the active layer of the at least one thin film transistor.

18 Claims, 6 Drawing Sheets

(52) U.S. Cl.
CPC ...... *H01L 27/0292* (2013.01); *H01L 27/0296* (2013.01); *H01L 27/124* (2013.01); *H01L 27/127* (2013.01); *H01L 27/1225* (2013.01); *H01L 27/1255* (2013.01)

(58) Field of Classification Search
CPC ............. H01L 27/1255; H01L 27/0288; H01L 27/0292; H01L 22/32; H05F 3/00; G02F 1/1333
See application file for complete search history.

(56) References Cited

U.S. PATENT DOCUMENTS

| | | | |
|---|---|---|---|
| 6,013,923 A * | 1/2000 | Huang | ................ H01L 27/0251 257/59 |
| 6,342,931 B2 * | 1/2002 | Nagata | .............. G02F 1/136204 349/40 |
| 6,570,630 B2 | 5/2003 | Nakajima et al. | |
| 9,401,354 B1 * | 7/2016 | Bae | ....................... H10K 59/131 |
| 2002/0197776 A1 * | 12/2002 | Zhang | ............... G02F 1/136204 438/149 |
| 2003/0112402 A1 * | 6/2003 | Nakajima | ......... G02F 1/136204 349/149 |
| 2007/0131932 A1 | 6/2007 | Shin et al. | |
| 2011/0127519 A1 * | 6/2011 | Kang | ................... H10K 59/131 438/34 |
| 2014/0104741 A1 | 4/2014 | Oh et al. | |
| 2019/0057632 A1 | 2/2019 | Kim et al. | |
| 2019/0066595 A1 * | 2/2019 | Kim | ..................... G09G 3/3258 |

FOREIGN PATENT DOCUMENTS

| | | |
|---|---|---|
| CN | 110286513 A | 9/2019 |
| JP | 108101397 A | 4/1996 |
| JP | 10268794 A | 10/1998 |

* cited by examiner

MOTHERBOARD AND MANUFACTURING METHOD FOR MOTHERBOARD

TECHNICAL FIELD

The present disclosure relates to a motherboard and a manufacturing method for the motherboard.

BACKGROUND

Organic Light Emitting Diode (OLED) display devices have the characteristics of wide viewing angle, high contrast and fast response speed. Moreover, compared with inorganic light emitting display devices, the organic light emitting diode display devices have the advantages such as higher light-emission luminance and lower drive voltage. Due to the above characteristics and advantages, the organic light emitting diode (OLED) display devices have gradually attracted widespread attention and can be applied to devices with display functions such as mobile phones, monitors, notebook computers, digital cameras, instruments and meters.

SUMMARY

At least one embodiment of the present disclosure provides a motherboard, the motherboard includes: at least one display area, a periphery area surrounding the at least one display area, a plurality of test terminals, an electrostatic discharge line, a plurality of resistors, and at least one thin film transistor; the plurality of test terminals, the electrostatic discharge line and the plurality of resistors are located in the periphery area; the at least one thin film transistor is located in at least one selected from the group consisting of the at least one display area and the periphery area; the plurality of test terminals are respectively electrically connected to the electrostatic discharge line through the plurality of resistors; at least one of the plurality of resistors includes an inorganic nonmetal trace; the at least one thin film transistor includes an active layer; and the inorganic nonmetal trace include a same semiconductor matrix material as the active layer of the at least one thin film transistor.

For example, in at least one example of the motherboard, the semiconductor matrix material is an oxide semiconductor material.

For example, in at least one example of the motherboard, the oxide semiconductor material is indium gallium zinc oxide.

For example, in at least one example of the motherboard, the active layer includes a source region, a drain region and a channel region, and the channel region is located between the source region and the drain region; an electrical conductivity of the inorganic nonmetal trace is higher than an electrical conductivity of the channel region; and the electrical conductivity of the inorganic nonmetal trace is less than or equal to an electrical conductivity of the source region and an electrical conductivity of the drain region.

For example, in at least one example of the motherboard, the inorganic nonmetal trace contains doping impurity, and the source region and the drain region contain the doping impurity; and a concentration of the doping impurity in the inorganic nonmetal trace is less than or equal to a concentration of the doping impurity in the source region and a concentration of the doping impurity in the drain region.

For example, in at least one example of the motherboard, the channel region does not contain the doping impurity.

For example, in at least one example of the motherboard, the plurality of test terminals are sequentially arranged in a first direction, and the plurality of resistors are sequentially arranged in the first direction; and the test terminals and the resistors are alternately arranged in the first direction.

For example, in at least one example of the motherboard, the inorganic nonmetal trace includes a fold-line trace, a first end of the fold-line trace is electrically connected to a corresponding one of the plurality of test terminals, and a second end of the fold-line trace is electrically connected to the electrostatic discharge line.

For example, in at least one example of the motherboard, at least one of the plurality of first fold-line units includes a first line segment, a second line segment, a third line segment and a fourth line segment which are sequentially connected in the first direction; the first line segment and the third line segment extend along the first direction, and the second line segment and the fourth line segment extend along a second direction crossing the first direction; the first line segment and the third line segment are spaced apart in the second direction, and the second line segment and the fourth line segment are spaced apart in the first direction; and an end-point of the first line segment is connected to a starting-point of the second line segment, an end-point of the second line segment is connected to a starting-point of the third line segment, and an end-point of the third line segment is connected to a starting-point of the fourth line segment.

For example, in at least one example of the motherboard, a length of the second line segment is equal to $1/16$-$1/2$ of a distance between two adjacent test terminals in the first direction.

For example, in at least one example of the motherboard, in a second direction crossing the first direction, the first fold-line unit is located between a straight line where upper edges of the plurality of test terminals are located and a straight line where lower edges of the plurality of test terminals are located.

For example, in at least one example of the motherboard, an extension length of the first fold-line unit in the second direction is equal to $1/2$-$4/5$ of a size of the test terminals in the second direction.

For example, in at least one example of the motherboard, a sheet resistance of the fold-line trace is in a range from 100 ohms to 300 ohms.

For example, in at least one example of the motherboard, a ratio of a physical length of the fold-line trace to a line-width of the fold-line trace is greater than or equal to 700 and less than or equal to 2000.

For example, in at least one example of the motherboard, the fold-line trace is a rectangular fold-line or a zigzag fold-line.

For example, in at least one example of the motherboard, each of the at least one display area includes a plurality of first signal lines extending side by side to an outside of each of the at least one display area; and the plurality of test terminals includes a first test terminal, and the plurality of first signal lines are electrically connected to the first test terminal.

For example, in at least one example of the motherboard, each of the at least one display area further includes a plurality of second signal lines extending side by side to the outside of each of the at least one display area; the plurality of first signal lines cross the plurality of second signal lines; the plurality of test terminals further include a second test terminal; and the plurality of second signal lines are electrically connected to the second test terminal.

For example, in at least one example of the motherboard, the motherboard includes a gate drive circuit, the gate drive circuit is located in the periphery area and the gate drive circuit includes a first number of thin film transistors in the at least one thin film transistor; and the first number is less than or equal to a number of the at least one thin film transistor.

For example, in at least one example of the motherboard, each of the at least one display area further includes a plurality of sub-pixels arranged in an array; each sub-pixel includes a pixel drive circuit and a light emitting element; the pixel drive circuit includes a second number of thin film transistors in the at least one thin film transistor and the pixel drive circuit is configured to drive the light emitting element; and the second number is less than or equal to the number of the at least one thin film transistor.

For example, in at least one example of the motherboard, the motherboard includes an insulating layer positioned between the electrostatic discharge line and the plurality of resistors, the insulating layer includes a plurality of via holes, and, the electrostatic discharge line and the plurality of resistors are respectively electrically connected through the plurality of via holes.

At least one embodiment of the present disclosure provides a manufacturing method for a motherboard, the motherboard includes: at least one display area and a periphery area surrounding the at least one display area, the manufacturing method includes: forming a plurality of test terminals, an electrostatic discharge line and a plurality of resistors in the periphery area; and forming at least one thin film transistor in at least one of the at least one display region and the periphery area. the plurality of test terminals are respectively electrically connected to the electrostatic discharge line through the plurality of resistors; at least one of the plurality of resistors includes an inorganic nonmetal trace; the at least one thin film transistor includes an active layer; and using a same semiconductor matrix material to form the trace and the active layer.

For example, in at least one example of the manufacturing method, forming the plurality of resistors in the periphery area and forming the at least one thin film transistor in at least one of the at least one display area and the periphery area include: forming a semiconductor matrix material layer; patterning the semiconductor matrix material layer to form a first pattern and a second pattern; conductor-processing the first pattern to form the trace, and the second pattern is used to form the active layer of the at least one thin film transistor.

For example, in at least one example of the manufacturing method, the active layer includes a source region, a drain region and a channel region, the channel region is located between the source region and the drain region; and the manufacturing method further includes: conductor-processing part of the second pattern to form the source region and the drain region, while not conductor-processing part of the second pattern to form the channel region.

For example, in at least one example of the manufacturing method, the conductor-processing includes at least one selected from the group consisting of doping and plasma processing.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
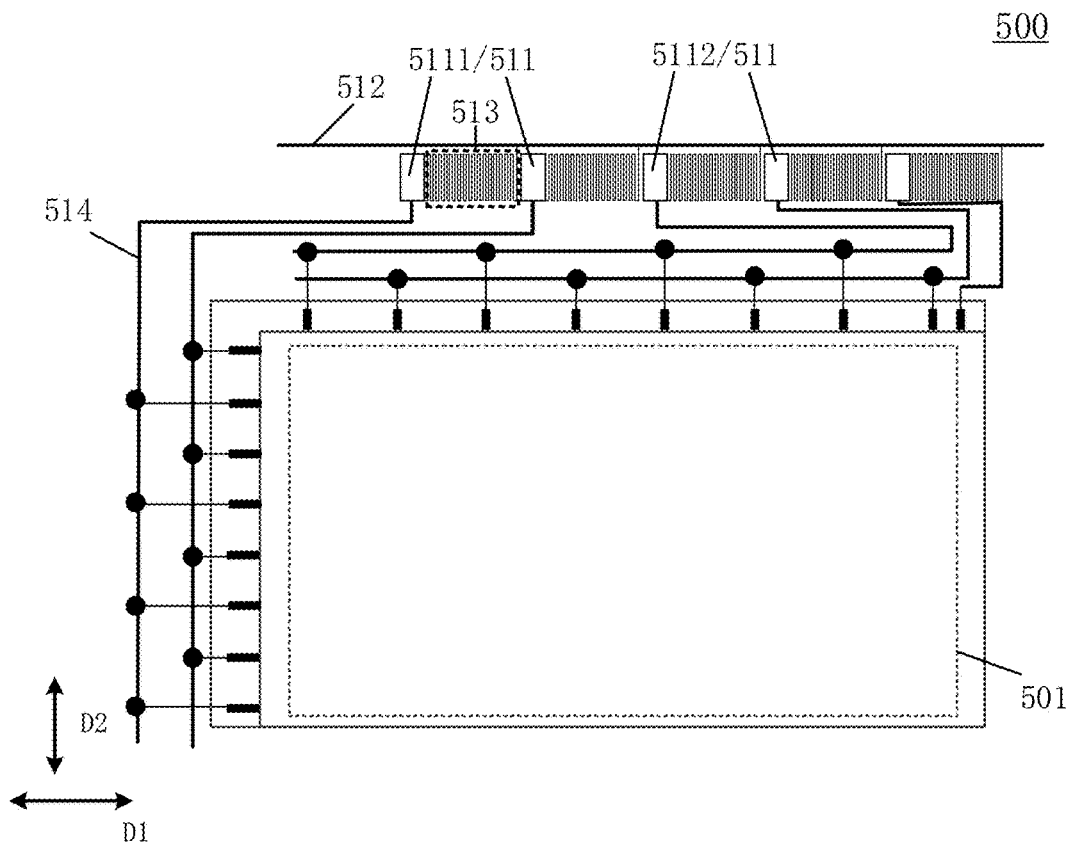
FIG. 1A shows a motherboard.

FIG. 1A shows a motherboard 500. As shown in FIG. 1A, the motherboard 500 includes at least one display area 501 and a periphery area (not marked in the figure) surrounding the at least one display area 501. The periphery area includes a plurality of test terminals (pad) 511, an electrostatic discharge line 512 and a plurality of resistors 513.

Figure 1B:
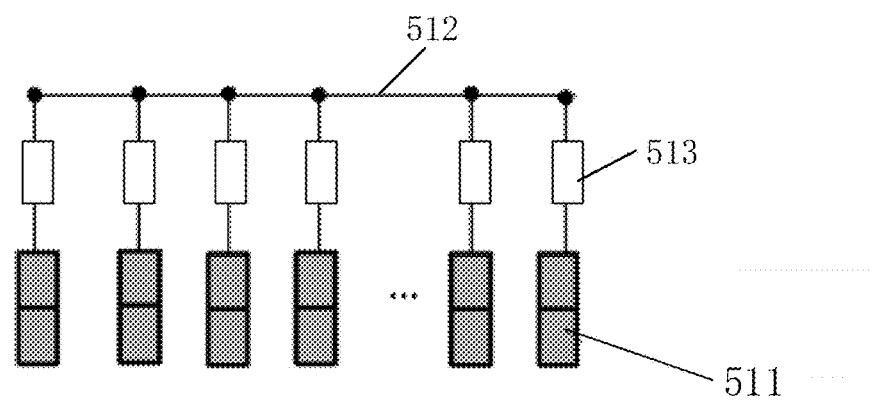
FIG. 1B is an equivalent schematic diagram of connection relationship among a plurality of test terminals, an electrostatic discharge line and a plurality of resistors of the motherboard shown in FIG. 1A.

FIG. 1B is an equivalent schematic diagram of the connection relationship among the plurality of test terminals 511, the electrostatic discharge line 512 and the plurality of resistors 513 of the motherboard 500 shown in FIG. 1A. As shown in FIG. 1B, the plurality of test terminals 511 are electrically connected to the electrostatic discharge line 512 through the plurality of resistors 513 respectively.

As shown in FIG. 1A, the display area 501 includes a plurality of signal lines extending side by side to an outside of each of the at least one display area 501 (a portion of the signal lines located in the display area 501 is not shown in FIG. 1A), and each of the plurality of test terminals 511 is electrically connected to corresponding signal lines through one of a plurality of short-circuit connection lines 514 (for example, short-circuit rings).

As shown in FIG. 1A, the plurality of test terminals 511 are sequentially arranged in a first direction D1, and the plurality of resistors 513 are sequentially arranged in the first direction D1. The test terminals 511 and the resistor 513 are alternately arranged in the first direction D1.

For example, the plurality of signal lines include a plurality of first signal lines and a plurality of second signal lines, each of the plurality of first signal lines and each of the plurality of second signal lines extend along the first direction D1 and the second direction D2 respectively, and the plurality of first signal lines cross the plurality of second signal lines. The plurality of test terminals 511 include first test terminals 5111 and second test terminals 5112. The plurality of first signal lines are electrically connected to the first test terminals 5111. The plurality of second signal lines are electrically connected to the second test terminals 5112. For example, the first signal line and the second signal line are respectively a gate line and a data line.

For example, the display area 501 further includes a plurality of sub-pixels arranged in an array, each sub-pixel includes a pixel drive circuit and a light emitting element, and the pixel drive circuit is configured to drive the light emitting element. For example, the light emitting element is a bottom-emission type light emitting element. For example, the light emitting element includes a first electrode, a light emitting layer, and a second electrode which are sequentially arranged. For example, the first electrode and the second electrode are an anode and a cathode respectively, and the light emitting layer is an organic light emitting layer. For example, the first electrode has a first reflectivity to the light emitted by the light emitting layer and the second electrode has a second reflectivity to the light emitted by the light emitting layer, and the first reflectivity is smaller than the second reflectivity, so that the light emitted by the light emitting layer leaves the light emitting element through the first electrode; that is, the light emitting element is the bottom-emission type light emitting element. For example, the first electrode is formed of a transparent conductive material. For example, the transparent conductive material is indium tin oxide (ITO) or indium zinc oxide (IZO).

Figure 1C:
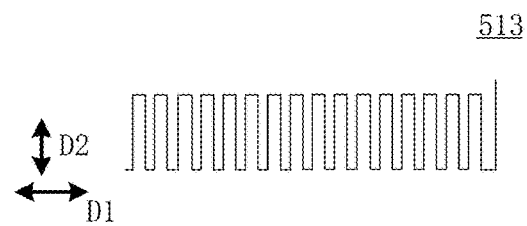
FIG. 1C is an enlarged diagram of a resistor shown in FIG. 1A.

FIG. 1C is an enlarged diagram of the resistor 513 shown in FIG. 1A. For example, as shown in FIG. 1C, at least one of the plurality of resistors 513 is implemented as a trace, and the material of the trace is the same as the material of the first electrode. For example, the trace is formed in the same patterning process as the first electrode. For example, the trace may be formed of indium tin oxide (ITO).

The inventors of the present disclosure notice that, because each test terminal 511 is connected to the plurality of signal lines, in the case where a large amount of electrostatic charges are accumulated on at least one test terminal 511 and the test terminal 511 is not connected to the electrostatic discharge line 512, the test terminal 511 accumulated with the large amount of electrostatic charges may be failure caused by electrostatic discharging (for example, burning phenomenon caused by electrostatic charge accumulation).

For example, in the case where the plurality of test terminals 511 are connected to the electrostatic discharge line 512 through the plurality of resistors 513 respectively, the electrostatic charges on the test terminals 511 accumulated with the large amount of electrostatic charges can be transferred toward adjacent test terminals 511 through the electrostatic discharge line 512. For example, in the process of transferring the electrostatic charges toward the other test terminals 511, the corresponding resistor 513 will lose at least part of the electrostatic charges to protect other structures electrically connected to the other test terminals 511.

The inventors of the present disclosure notice that, in the case where a resistance of each resistor 513 is greater than 70,000 ohms, the resistor 513 can effectively lose electrostatic charges. The inventors of the present disclosure notice that, because an electrical conductivity of the first electrode is relatively large, in the case where the trace of the resistor 513 is formed in the same patterning process as a first electrode (for example, an anode) of a top-emission type light emitting element, a physical length of the trace of each resistor 513 is designed to be relatively long, in order to allow the resistance of each resistor 513 to be greater than 70,000 ohms. Because a distance between adjacent test terminals 511 in the first direction D1 is limited, the trace needs to be arranged in a winding form (that is the trace of the resistor 513 is a fold-line trace). However, a distance between parallel line segments of the fold-line trace is relatively small, which increases the manufacturing difficulty and reduces the free-defect ratio of the fold-line trace (for example, short circuits may be occurred in the parallel arrangement of the fold-line trace or adjacent line segments; or the fold-line trace has a broken circuit caused by reducing the width of the trace). It should be noted that the physical length of the trace refers to the length of the trace in the first direction when it is assumed that the trace is stretched to a straight line parallel to the first direction.

In addition, the inventors of the present disclosure also notice that, the technical scheme that the trace of the resistor 513 is formed in the same patterning process as the first electrode (for example, an anode) of the light emitting element has a narrow application range. For example, in the case where the light emitting element is implemented as the top-emission type light emitting element, it is difficult to use the above technical scheme because the electrical conductivity of the anode of the top-emission type light emitting element is greater than the electrical conductivity of the anode of the bottom-emission type light emitting element (because the anode of the top-emission type light emitting element includes a metal material). For another example, the motherboard that does not include a self-luminous light emitting element (for example, a motherboard for forming a liquid crystal display panel) is also difficult to use the above technical scheme.

At least one embodiment of the present disclosure provides a motherboard and a manufacturing method for the motherboard, the motherboard includes at least one display area, a periphery area surrounding the at least one display area, a plurality of test terminals, an electrostatic discharge line, a plurality of resistors and at least one thin film transistor. The plurality of test terminals, the electrostatic discharge line and the plurality of resistors are located in the periphery area. The at least one thin film transistor is located in at least one selected from the group consisting of the at least one display area and the periphery area. The plurality of test terminals are electrically connected to the electrostatic discharge line through the plurality of resistors respectively. At least one of the plurality of resistors includes an inorganic nonmetal trace. The at least one thin film transistor includes an active layer, and the inorganic nonmetal trace includes a same semiconductor matrix material as the active layer of the at least one thin film transistor. The motherboard and the manufacturing method for the motherboard can improve the free-defect ratio.

The motherboard provided according to the embodiments of the present disclosure will be explained by several examples. As described below, different features in these specific examples can be combined with each other without conflicting with each other, so as to obtain new examples, which also belong to the protection scope of the present disclosure.

Figure 2:
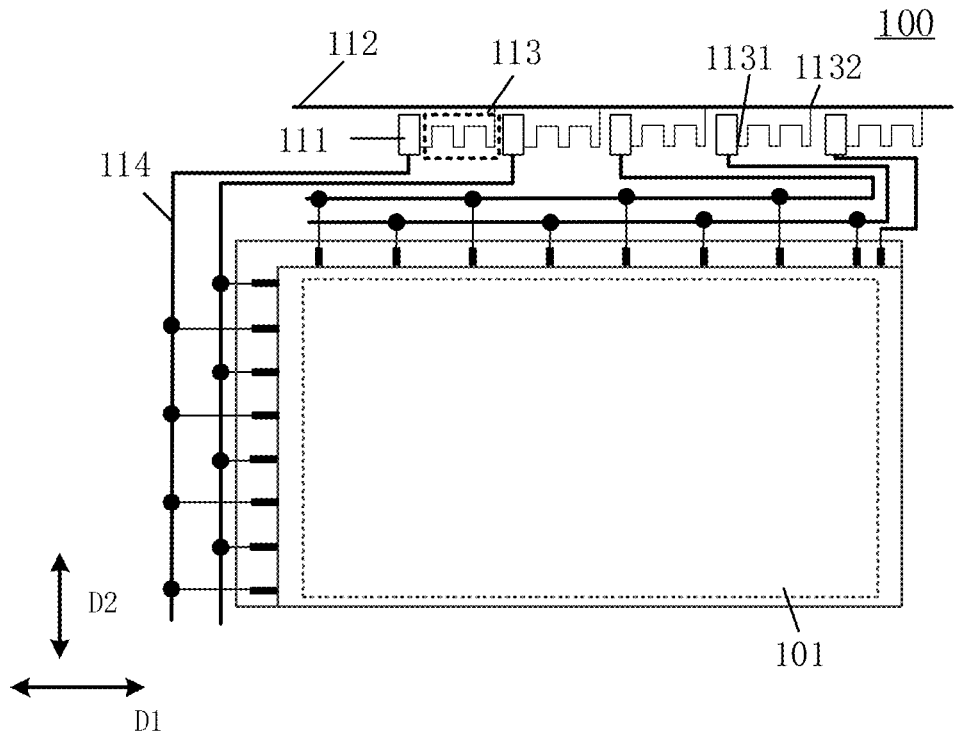
FIG. 2 is a schematic plan view of a motherboard provided by at least one embodiment of the present disclosure.

FIG. 2 is a schematic plan view of a motherboard 100 provided according to at least one embodiment of the present disclosure. As shown in FIG. 2, the motherboard 100 includes a plurality of test terminals 111, an electrostatic discharge line 112 and a plurality of resistors 113. As shown in FIG. 2, the motherboard 100 further includes at least one display area 101 and a periphery area (not marked in FIG. 2) surrounding the at least one display area 101, and the plurality of test terminals 111, the electrostatic discharge line 112 and the plurality of resistors 113 are located in the periphery area.

It should be noted that, for clarity purpose, FIG. 2 and other drawings only show one display area 101 and the periphery area surrounding the display area 101, but the embodiments of the present disclosure are not limited to this. For example, the motherboard 100 may include a plurality of display areas 101 arranged in an array and a plurality of periphery areas respectively surrounding the plurality of display areas 101, which will not be described in detail here.

For example, as shown in FIG. 2, the plurality of test terminals 111 are sequentially arranged in the first direction D1, and the plurality of resistors 113 are sequentially arranged in the first direction D1. The test terminals 111 and the resistors 113 are alternately arranged in the first direction D1.

For example, as shown in FIG. 2, the plurality of test terminals 111 are electrically connected to the electrostatic discharge line 112 through the plurality of resistors 113 respectively. For example, as shown in FIG. 2, at least one of the plurality of resistors 113 (for example, each of the plurality of resistors 113) includes an inorganic nonmetal trace, and the inorganic nonmetal trace includes a fold-line trace. For example, as shown in FIG. 2, a first end 1131 of the fold-line trace is electrically connected to a corresponding one of the plurality of test terminals 111, and a second end 1132 of the fold-line trace is electrically connected to the electrostatic discharge line 112.

Figure 3A:
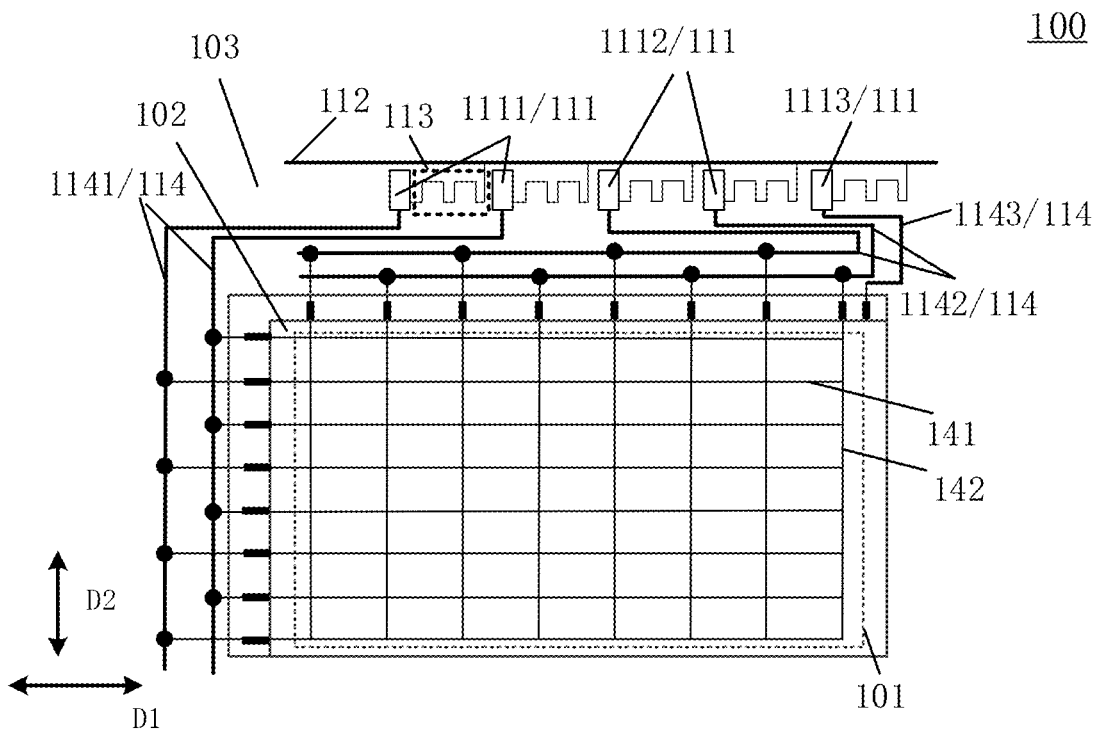
FIG. 3A is another schematic plan view of a motherboard provided by at least one embodiment of the present disclosure.

FIG. 3A is another schematic plan view of a motherboard 100 provided by at least one embodiment of the present disclosure. The schematic plan view of the motherboard 100 shown in FIG. 3A is similar to the schematic plan view of the motherboard 100 shown in FIG. 2. The main difference is that the schematic plan view of the motherboard 100 shown in FIG. 3A further shows a plurality of first signal lines 141 and a plurality of second signal lines 142 in the display area 101.

For example, as shown in FIG. 3A, the display area 101 includes the plurality of first signal lines 141 extending side by side to an outside of the display area 101. The plurality of test terminals 111 include first test terminals 1111, and the plurality of first signal lines 141 are electrically connected to the first test terminals 1111. For example, as shown in FIG. 3A, the display area 101 further includes a plurality of second signal lines 142 extending side by side to an outside of the display area 101. The plurality of first signal lines 141 cross the plurality of second signal lines 142. The plurality of test terminals 111 further include second test terminals 1112. The plurality of second signal lines 142 are electrically connected to the second test terminals 1112.

For example, as shown in FIG. 3A, the periphery area further includes a plurality of short-circuit connection lines 114. For example, the plurality of short-circuit connection lines 114 are in one-to-one correspondence with the plurality of test terminals 111.

For example, as shown in FIG. 3A, the motherboard 100 includes two first test terminals 1111 and two second test terminals 1112. The plurality of short-circuit connection lines 114 include two first short-circuit connection lines 1141 and two second short-circuit connection lines 1142. One first test terminal 1111 is electrically connected to the first signal lines 141 located in the odd rows through one first short-circuit connection line 1141, and the other first test terminal 1111 is electrically connected to the first signal lines 141 in the even rows through the other first short-circuit connection line 1141. One second test terminal 1112 is electrically connected to the second signal lines 142 located in the odd columns through one second short-circuit connection line 1142, and the other second test terminal 1112 is electrically connected to the second signal lines 142 located in the even columns through the other second short-circuit connection line 1142.

For example, as shown in FIG. 3A, the first signal line 141 and the second signal line 142 respectively extend along the first direction D1 and the second direction D2. For example, the first direction D1 and the second direction D2 are perpendicular to each other. For example, the first signal line 141 and the second signal line 142 are respectively a gate line and a data line.

For example, as shown in FIG. 3A, the plurality of test terminals 111 further include one third test terminal 1113, and the plurality of short-circuit connection lines 114 further include one third short-circuit connection line 1143. The display area 101 includes a common electrode line extending to an outside of the display area 101 (the part of the common electrode line located in the display area 101 is not shown in the figure), and the common electrode line is electrically connected to the third test terminal 1113 through the third short-circuit connection line 1143.

For example, as shown in FIG. 3A, the periphery area include a first periphery area 102 surrounding the display area 101 and a second periphery area 103 surrounding the first periphery area 102, and the first periphery area 102 is located between the display area 101 and the second periphery area 103. The plurality of test terminals 111, the electrostatic discharge line 112 and the plurality of resistors 113 are located in the second periphery area 103.

For example, the motherboard 100 provided by the above embodiments of the present disclosure will be cut after the manufacturing and testing processes are completed, and finally a single independent display panel is obtained. The obtained independent display panel will be subjected to subsequent processes. For example, the first periphery area 102 remains in the obtained single panel, but at least part of the second periphery area 103 (for example, the entire second periphery area 103) is cut away, therefore, the test terminal 111, the electrostatic discharge line 112, the resistor 113 and the short-circuit connection line 114 may not remain in the obtained single panel.

In some examples, at least one selected from the group consisting of the test terminal 111, the electrostatic discharge line 112, the resistor 113 and the short-circuit connection line 114 may also remain in the obtained single panel.

Figure 3B:
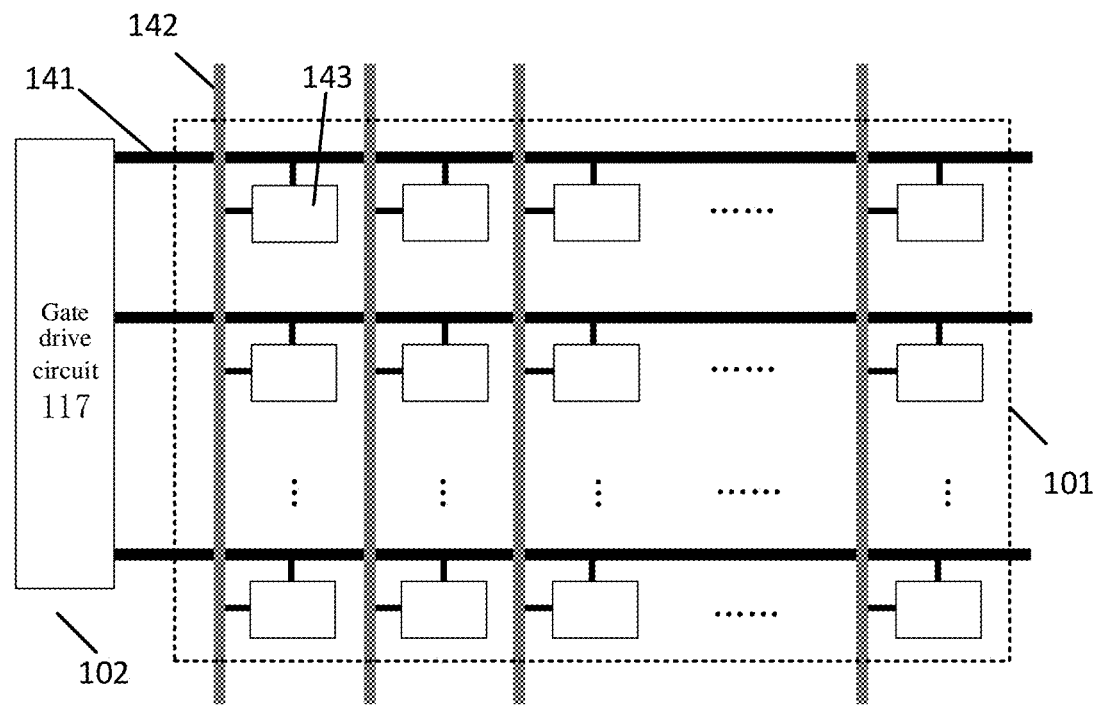
FIG. 3B is a schematic plan view of a display area and a first periphery area of the motherboard shown in FIG. 3A.

FIG. 3B is a schematic plan view of the display area 101 and the first periphery area 102 of the motherboard 100 shown in FIG. 3A. For example, as shown in FIG. 3B, the motherboard 100 further includes a gate drive circuit 117. The gate drive circuit 117 is located in the periphery area (for example, the first periphery area 102) and the gate drive circuit 117 includes a thin film transistor (not shown in FIG. 3B). As shown in FIG. 3B, a plurality of signal output terminals of the gate drive circuit 117 are electrically connected to the plurality of first signal lines (for example, gate lines) 141 to provide gate scan signals for the plurality of the gate lines. For example, the periphery area (for example, the first periphery area 102) further includes a data drive circuit, and a plurality of signal output terminals of the data drive circuit are electrically connected to the plurality of second signal lines (for example, data lines) to provide data signals for the plurality of the data lines. For example, as shown in FIG. 3B, the display area 101 further includes a plurality of sub-pixels 143 arranged in an array, each sub-pixel 143 includes a pixel drive circuit and a light emitting element; the pixel drive circuit includes a thin film transistor (not shown in FIG. 3B) and the pixel drive circuit is configured to drive the light emitting element. For clarity purpose, a structure of the gate drive circuit 117 and a structure of the sub-pixel 143 will be described in the examples shown in FIGS. 6 and 7, and will not be described in detail here.

For example, the inorganic nonmetal trace may include a semiconductor matrix material. For example, the inorganic nonmetal trace include the same semiconductor matrix material as the active layer of the thin film transistor of at least one selected from the group consisting of the gate drive circuit 117 and the pixel drive circuit. For example, the semiconductor matrix material is an oxide semiconductor material or a polysilicon material. For example, the oxide semiconductor material is indium gallium zinc oxide.

For example, by allowing the inorganic nonmetal trace to include the same semiconductor matrix material as the active layer of the thin film transistor of at least one selected from the group consisting of the gate drive circuit 117 and the pixel drive circuit, the electrical conductivity of the inorganic nonmetal trace can be reduced, thereby making the physical length of the inorganic nonmetal trace as short as possible under the condition that the inorganic nonmetal trace can effectively lose electrostatic charges (for example, under the condition that the resistance of the inorganic nonmetal trace is greater than 70,000 ohms). In this case, it is possible to reduce the winding times of the inorganic nonmetal trace and the fold-line trace, as well as the parallel arrangement of the fold-line trace and the spacing between adjacent line segments (for example, the spacing between the first line segment 122 and the third line segment 124 adjacent to each other in the second direction D2 shown in FIG. 4A), thereby reducing the manufacturing difficulty and free-defect ratio of the inorganic nonmetal trace.

For example, by allowing the inorganic nonmetal trace to include the same semiconductor matrix material as the active layer of the thin film transistor of at least one selected from the group consisting of the gate drive circuit 117 and the pixel drive circuit, the inorganic nonmetal trace can also be manufactured by using the manufacturing process of the thin film transistor, thereby simplifying the manufacturing process of the motherboard 100 provided by at least one embodiment of the present disclosure.

For example, by allowing the inorganic nonmetal trace to include the same semiconductor matrix material as the active layer of the thin film transistor of at least one selected from the group consisting of the gate drive circuit 117 and the pixel drive circuit, the motherboard 100 provided by at least one embodiment of the present disclosure can also be suitable for forming a display panel with a top-emission type light emitting element, a display panel with a bottom-emission type light emitting element, a liquid crystal display panel or other display panels with a thin film transistor.

Figure 3C:
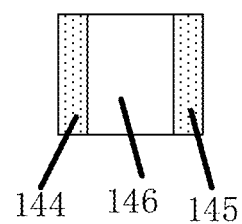
FIG. 3C is a schematic plan view of an active layer of a thin film transistor of a motherboard provided by at least one embodiment of the present disclosure.

FIG. 3C is a schematic plan view of an active layer of a thin film transistor of the motherboard 100 provided by at least one embodiment of the present disclosure. As shown in FIG. 3C, the active layer includes a source region 144, a drain region 145 and a channel region 146. The channel region 146 is located between the source region 144 and the drain region 145. For example, an electrical conductivity of the inorganic nonmetal trace is higher than an electrical conductivity of the channel region 146 (for example, the electrical conductivity of the channel region 146 is measured in the case where the thin film transistor is not turned on). For example, the electrical conductivity of the inorganic nonmetal trace is not higher than an electrical conductivity of the source region 144 and an electrical conductivity of the drain region 145.

For example, by allowing the electrical conductivity of the inorganic nonmetal trace to be higher than the electrical conductivity of the channel region 146, the electrostatic charges can be transmitted along the electrostatic discharge line 112 toward other test terminals 111 while ensuring effective loss of the electrostatic charges.

For example, the electrical conductivity of the inorganic nonmetal trace can be improved by conductor-processing the semiconductor matrix material for forming the inorganic nonmetal trace. The conductor-processing refers to the treatment performed on the materials to increase the electrical conductivity of the materials. For example, the method of conductor-processing the semiconductor matrix material for forming the inorganic nonmetal trace can be set according to actual application requirements, which is not specifically limited by the embodiments of the present disclosure. For example, the conductor-processing includes at least one selected from the group consisting of doping and plasma processing. For example, the method of conductor-processing by using doping or plasma processing may refer to related technologies and will not be described here.

For example, the electrical conductivity of the inorganic nonmetal trace can be better controlled without increasing the process complexity by conductor-processing the semiconductor matrix material (which is the same as the semiconductor matrix material included in the inorganic nonmetal trace and the active layer of the thin film transistor of at least one selected from the group consisting of the gate driving circuit 117 and the pixel driving circuit), thereby improving the design freedom while improving the free-defect ratio of the motherboard 100.

For example, a sheet resistance of the inorganic nonmetal trace (the fold-line trace) is in a range from 100 ohms to 300 ohms (for example, 200 ohms). For example, the sheet resistance of the trace is equal to the ratio of the electrical conductivity of the trace material to the thickness of the trace. For example, the ratio of the physical length of the fold-line trace to the line-width of the fold-line trace is greater than or equal to 700 and less than or equal to 2000 (for example, 1000-1500; for example, 1200). For example, because the resistance value of the fold-line trace is equal to the product of the sheet resistance of the fold-line trace and the ratio of the physical length of the fold-line trace to the line-width of the fold-line trace, the resistance value of the fold-line trace (or the resistor 113) is in a range from 70,000 ohms to 600,000 ohms (for example, in a range from 100,000 ohms to 450,000 ohms; for example, 240,000 ohms).

For example, the method of conductor-processing the semiconductor matrix material for forming the inorganic nonmetal trace may be the same as the method of conductor-processing the partial area of the semiconductor layer of the thin film transistor to form the source region 144 and the drain region 145.

For example, the inorganic nonmetal trace contains a doping impurity, and the source region 144 and the drain region 145 contain a doping impurity. For example, the channel region 146 does not contain doping impurity or the doping impurity contained in the channel region 146 is different from the doping impurity contained in the source region 144 and the drain region 145. For example, the doping impurity contained in the inorganic nonmetal trace is the same as the doping impurity contained in the source region 144 and the drain region 145. For example, the inorganic nonmetal trace, the source region 144 and the drain region 145 are formed through the same patterning process and the same doping process. For example, a concentration of the doping impurity in the inorganic nonmetal trace is not higher than a concentration of the above doping impurity in the source region 144 and a concentration of the above doping impurity in the drain region 145.

The shape of the fold-line trace can be set according to actual application requirements, which is not specifically limited by the embodiments of the present disclosure. For example, the fold-line trace shown in FIGS. 2 and 3A may be a rectangular fold-line trace, a zigzag fold-line trace or traces with other suitable shapes. The following is an exemplary description with reference to FIGS. 4A-4C.

Figure 4A:
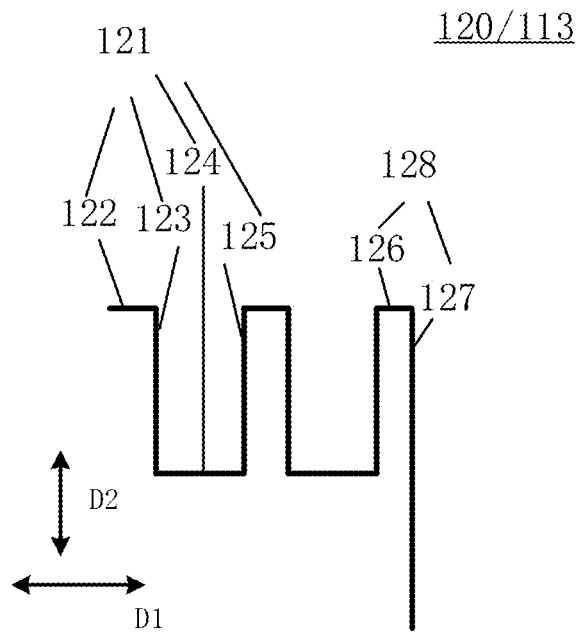
FIG. 4A shows an example of a fold-line trace of a resistor provided by at least one embodiment of the present disclosure.

FIG. 4A shows an example of the fold-line trace of the resistor 113 provided by at least one embodiment of the present disclosure. As shown in FIG. 4A, the fold-line trace includes a plurality of first fold-line units 121 sequentially arranged in the first direction D1 and connected to each other. At least one of the plurality of first fold-line units 121 (for example, each of the plurality of first fold-line units 121) includes a first line segment 122, a second line segment 123, a third line segment 124, and a fourth line segment 125 which are sequentially connected in the first direction D1. The first line segment 122 and the third line segment 124 extend along the first direction D1, and the second line segment 123 and the fourth line segment 125 extend along the second direction D2 crossing the first direction D1. The first line segment 122 and the third line segment 124 are spaced apart in the second direction D2, and the second line segment 123 and the fourth line segment 125 are spaced apart in the first direction D1. An end-point of the first line segment 122 is connected to a starting-point of the second line segment 123, an end-point of the second line segment 123 is connected to a starting-point of the third line segment 124, and an end-point of the third line segment 124 is connected to a starting-point of the fourth line segment 125. For example, among the plurality of first fold-line units 121, the starting-point of the first line segment 122 of the first fold-line unit 121 adjacent to the test terminal 111 is implemented as a first end of the fold-line trace.

As shown in FIG. 4A, the fold-line trace further includes a second fold-line unit 128. The second fold-line unit 128 includes a fifth line segment 126 and a sixth line segment 127 which are sequentially arranged in the first direction D1. The fifth line segment 126 extends along the first direction D1 and the sixth line segment 127 extends along the second direction D2. An end-point of the fourth line segment 125 is connected to a starting-point of the fifth line segment 126, an end-point of the fifth line segment 126 is connected to a starting-point of the sixth line segment 127, and an end-point of the sixth line segment 127 is electrically connected to the electrostatic discharge line 112.

For example, a length of the first line segment 122 and a length of the third line segment 124 are smaller than a length of the second line segment 123 and a length of the fourth line segment 125. For example, a length of the fifth line segment 126 is smaller than a length of the sixth line segment 127. For example, the second line segment 123, the fourth line segment 125 and the sixth line segment 127 can be used as sub-resistors connected in series with each other, and the first line segment 122, the third line segment 124 and the fifth line segment 126 can be used as traces for connecting adjacent sub-resistors. In this case, at least one of the plurality of resistors 113 (for example, each of the plurality of resistors 113) can be regarded as a resistor string.

For example, as shown in FIG. 4A, the lengths of the plurality of first line segments 122 are not completely the same, the lengths of the plurality of third line segments 124 are not completely the same, and the lengths of the second line segments 123 and the fourth line segments 125 are the same. However, embodiments of the present disclosure are not limited thereto. For another example, the lengths of the first line segments 122 and the third line segments 124 are completely the same, and the lengths of the second line segments 123 and the fourth line segments 125 are the same. For another example, the lengths of the plurality of first line segments 122 and the plurality of third line segments 124 are completely the same, the lengths of the plurality of second line segments 123 are not completely the same, and the lengths of the plurality of fourth line segments 125 are not completely the same.

Figure 4B:
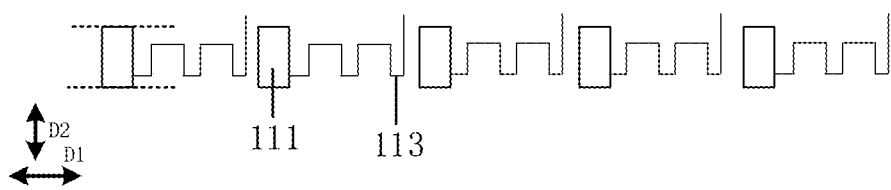
FIG. 4B is a schematic plan view of a test terminal and a fold-line trace of a resistor in the motherboard shown in FIG. 2.

FIG. 4B shows a schematic plan view of the test terminal 111 and the resistor 113 in the motherboard 100 shown in FIG. 2. As shown in FIG. 4B, in the second direction D2 crossing the first direction D1, the first fold-line unit 121 is located between a straight line (dashed line on the upper side shown in FIG. 4B) where upper edges of the plurality of test terminals 111 are located and a straight line (dashed line on the lower side shown in FIG. 4B) where lower edges of the plurality of test terminals 111 are located. For example, by positioning the first fold-line unit 121 between the straight line where upper edges of the plurality of test terminals 111 are located and the straight line where lower edges of the plurality of test terminals 111 are located in the second direction D2, it is possible to avoid the first fold-line unit 121 from occupying additional space in the periphery area, thereby being beneficial for reducing the size of the motherboard 100.

For example, as shown in FIGS. 2 and 4B, an extension length of the first fold-line unit 121 in the second direction D2 is equal to ½-⅘ (for example, ⅔) of a size of the plurality of test terminals 111 in the second direction D2. For example, the extension length of the first fold-line unit 121 in the second direction D2 refers to the maximum length of the first fold-line unit 121 in the second direction D2. For example, the extension length of the first fold-line unit 121 in the second direction D2 is equal to the length of the second line segment 123 and the length of the fourth line segment 125 in the second direction D2.

For example, the length of the second line segment 123 (or/and the length of the fourth line segment 125) is equal to 1/16-½ (for example, ⅕-⅓; for example, ¼) of a distance between two adjacent test terminals 111 in the first direction D1. For example, by allowing the length of the second line segment 123 to be equal to 1/16-½ of the distance between the two adjacent test terminals 111 in the first direction D1, the distance between first line segment 122 and third line segment 124 adjacent to each other in the first direction D1 can be increased. In this case, the possibility of short-circuit between the first line segment 122 and the third line segment 124 adjacent to each other or the possibility of brokencircuit caused by small trace width can be reduced. Therefore, the free-defect ratios of the fold-line trace and the motherboard 100 can be increased.

For example, the line-width of the fold-line trace is in a range from 10 microns to 20 microns (for example, equal to 10 microns, or 15 microns, or 20 microns). For example, the fold-line trace has a uniform line-width. In this case, the line-width of the fold-line trace is equal to the width of the second line segment 123, and the width of the second line segment 123 is equal to the width of the second line segment 123 in the direction perpendicular to the extending direction of the second line segment 123. In some examples, the fold-line trace may also have non-uniform line-widths. For example, the line-width of the first line segment 122 and the line-width of the third line segment 124 are larger than the line-width of the second line segment 123 and the line-width of the fourth line segment 125.

Figure 4C:
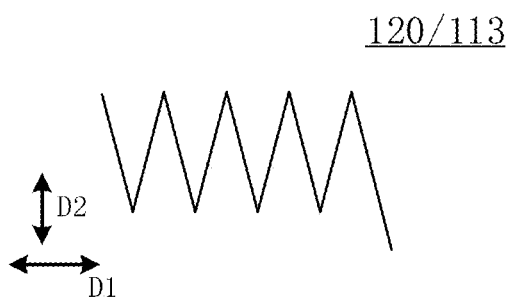
FIG. 4C shows another example of a fold-line trace of a resistor provided by at least one embodiment of the present disclosure.

FIG. 4C shows another example of the fold-line trace of the resistor 113 provided by at least one embodiment of the present disclosure. As shown in FIG. 4C, the fold-line trace of the resistor 113 is a zigzag trace.

Figure 5:
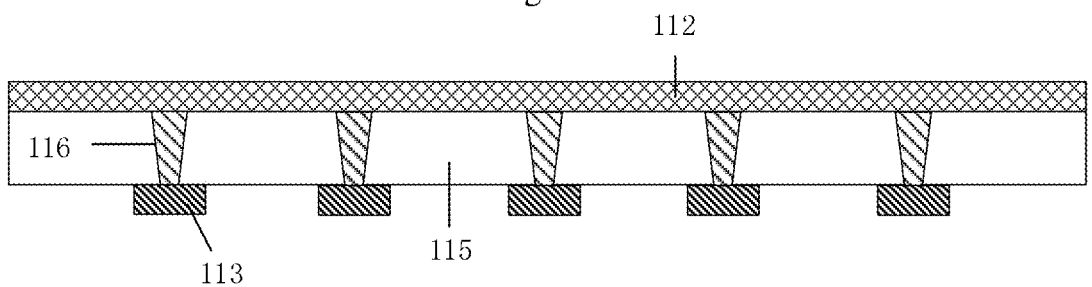
FIG. 5 is a schematic cross-sectional view of connection relationship between an electrostatic discharge line and a plurality of resistors provided by at least one embodiment of the present disclosure.

FIG. 5 is a schematic cross-sectional view of the connection relationship between the electrostatic discharge line 112 and the plurality of resistors 113 (the second ends of the refraction traces of the resistors 113) provided by at least one embodiment of the present disclosure. As shown in FIG. 5, the motherboard 100 further includes an insulating layer 115 between the electrostatic discharge line 112 and the plurality of resistors 113. The insulating layer 115 includes a plurality of via holes 116, and the electrostatic discharge line 112 is electrically connected to the plurality of resistors 113 through the plurality of via holes 116. For example, the electrostatic discharge line 112 may be formed in the same patterning process as the source electrode and drain electrode of the thin film transistor. In this case, the insulating layer 115 may be formed in the same patterning process as a passivation layer of the thin film transistor. For another example, the electrostatic discharge line 112 may also be formed in the same patterning process as the gate electrode of the thin film transistor. In this case, the insulating layer 115 may be formed in the same patterning process as the gate insulating layer 115 of the thin film transistor.

Figure 6:
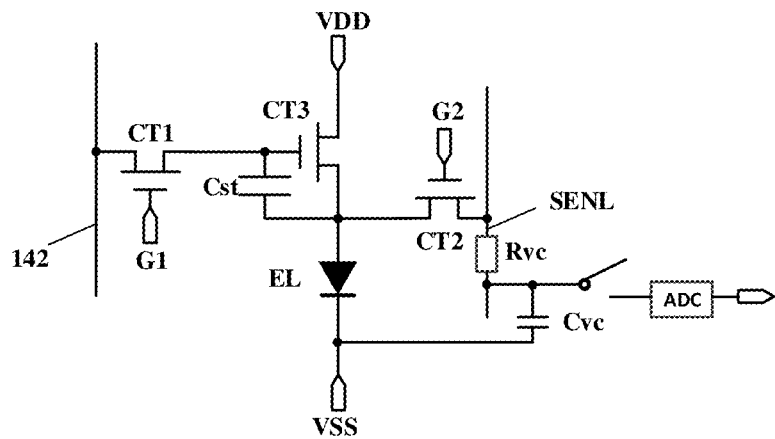
FIG. 6 is a schematic diagram of a 3T1C pixel circuit provided by at least one embodiment of the present disclosure.

With reference to FIG. 6, the pixel drive circuit and the light emitting element of the sub-pixel provided by at least one embodiment of the present disclosure will be exemplarily explained below. For example, the pixel drive circuit of the sub-pixel provided by at least one embodiment of the present disclosure may be a 2T1C pixel circuit (that is a pixel circuit including two thin film transistors and one storage capacitor), a 3T1C pixel circuit (that is a pixel circuit including three thin film transistors and one storage capacitor), a 4T1C pixel circuit (that is a pixel circuit including four thin film transistors and one storage capacitor) or other applicable pixel circuits.

FIG. 6 is a schematic diagram of a 3T1C pixel circuit provided by at least one embodiment of the present disclosure. For example, as shown in FIG. 6, the pixel circuit includes a drive transistor CT3 (including a gate electrode, a first electrode and a second electrode), a switch transistor CT1, a sense transistor CT2 and a storage capacitor Cst. For example, the semiconductor matrix material included in the inorganic nonmetal trace is the same as the semiconductor matrix material included in the switch transistor CT1, the sense transistor CT2 and the drive transistor CT3 (for example, the semiconductor matrix material are all indium gallium zinc oxides).

For example, as shown in FIG. 6, the switch transistor CT1 is used as an input write switch, a gate electrode of the switch transistor CT1 is used as a control terminal G1 and is connected to a gate line (not shown in FIG. 6 and see the first signal line 141 of FIG. 3B) to receive the gate scan signal; and a first electrode of the switch transistor CT1 and a second electrode of the switch transistor CT1 are respectively connected to the data line (the second signal line 142) and the gate electrode of the drive transistor CT3 to receive the data voltage and apply the received data voltage to the gate electrode of the drive transistor CT3 respectively. A first end of the storage capacitor Cst and a second end of the storage capacitor Cst are respectively connected to the gate electrode of the drive transistor CT3 and the first electrode of the drive transistor CT3, thereby storing the the data voltage applied to the gate electrode of the drive transistor CT3 and the first end of the storage capacitor Cst.

For example, as shown in FIG. 6, the sense transistor CT2 is used as a sense switch, and a first electrode of the sense transistor CT2 is connected to the first electrode of the drive transistor CT3. A second electrode of the sense transistor CT2 is connected to a sense line SENL for charging capacitors related to the sense line SENL to form a sense voltage, so that the sense voltage can be detected through the sense line SENL. The gate electrode of the sense transistor CT2 is used as a control terminal G2 and is connected to a sense scan line (not shown in FIG. 6 and see the first signal line 141 of FIG. 3B) to receive a sense control signal. For example, according to actual application requirements, the pixel circuit is further connected to the first power supply terminal VDD and the second power supply terminal VSS. For example, the voltage provided by the first power supply terminal VDD is greater than the voltage provided by the second power supply terminal VSS.

For example, in the case where there are parasitic capacitor Cvc and parasitic resistance Rvc on the sense line SENL, as shown in FIG. 6, the parasitic capacitor Cvc can be charged by the current from the drive transistor CT3, so that the voltage on the corresponding sense line SENL changes. However, the embodiments of the present disclosure are not limited to this, and in addition to using the parasitic capacitor Cvc on the sense line SENL, a sense capacitor Csc having one end connected to the sense line SENL and the other end connected to a certain fixed voltage (for example, grounding) may be provided separately.

For example, the control terminal G1 and the control terminal G2 are connected to different scan lines (for example, different first signal lines 141), so that the switch transistor CT1 and the sense transistor CT2 can be turned on at different times. For example, the drive transistor CT3, the switch transistor CT1 and the sense transistor CT2 are all N-type transistors.

For example, the light emitting element includes a first electrode, a light emitting layer, and a second electrode which are sequentially arranged. For example, the first electrode and the second electrode are an anode and a cathode respectively, and the light emitting layer is an organic light emitting layer. For example, the first electrode has a first reflectivity to the light emitted by the light emitting layer, the second electrode has a second reflectivity to the light emitted by the light emitting layer, and the first reflectivity is greater than the second reflectivity, so that the light emitted by the light emitting layer leaves the light emitting element through the second electrode, that is, the light emitting element is a top-emission type light emitting element. For example, the first electrode includes a metal material. For example, the second electrode is formed of a transparent conductive material.

The gate drive circuit of the motherboard provided by at least one embodiment of the present disclosure will be exemplarily explained with reference to FIG. 7. The gate drive circuit can be implemented as a GOA(Gate on Array). For example, in the case where the gate drive circuit 117 of the motherboard is implemented as the GOA, compared with the example where the gate drive circuit is implemented as a gate drive chip (IC), the frame size of the display panel obtained from the motherboard can be reduced, and the material cost for manufacturing the display panel can be reduced.

For example, the GOA may include a plurality of GOA units (that is shift registers) cascaded in sequence. For example, the GOA unit can be implemented as a 4T1C circuit structure (that is a circuit structure including four thin film transistors and one storage capacitor), an 8T1C structure (that is a circuit structure including eight thin film transistors and one storage capacitor), and a 12T1C structure (that is a circuit structure including twelve thin film transistors and one storage capacitor).

Figure 7:
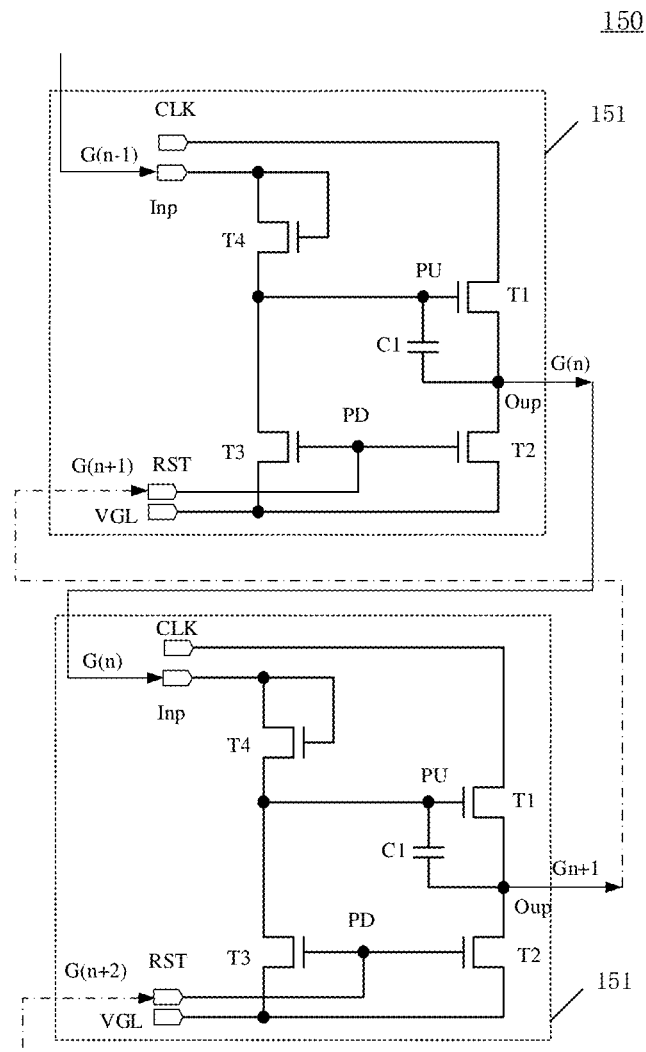
FIG. 7 is a schematic diagram of a GOA with a 4T1C circuit structure as a GOA unit provided by at least one embodiment of the present disclosure.

FIG. 7 is a schematic diagram of the GOA 150 with a 4T1C circuit structure as the GOA unit 151 provided by at least one embodiment of the present disclosure.

As shown in FIG. 7, the GOA 150 includes a plurality of GOA units 151 cascaded in sequence. For clarity purpose, the GOA shown in FIG. 7 only shows the GOA units of the nth and (n+1)th stages. The following illustrates the structure of the GOA unit by taking the GOA unit of the nth stage as an example.

As shown in FIG. 7, the GOA unit includes a first transistor T1, a second transistor T2, a third transistor T3, a fourth transistor T4 and a first capacitor C1.

As shown in FIG. 7, a first electrode of the first transistor T1 is connected to a clock signal CLK, and a second electrode of the first transistor T1 is connected to a first electrode of the second transistor T2 to obtain an output terminal Oup of the GOA unit, which can output the gate scan signal G(n) for the nth row of pixel units (this signal is a square wave pulse signal, and accordingly, the pulse part is ON level while the non-pulse part is OFF level). As shown in FIG. 7, the output terminal Oup of the GOA unit is electrically connected to a signal input terminal InP of the next-stage GOA unit to provide the gate scan signal G(n) to the next-stage GOA unit (as the input signal of the next-stage GOA unit or the turn-on signal of the next-stage GOA unit). The gate electrode of the first transistor T1 is connected to a pull-up node PU, thereby connecting a first electrode of the third transistor T3 and a second electrode of the fourth transistor T4.

As shown in FIG. 7, a second electrode of the second transistor T2 is connected to a second electrode of the third transistor T3 and a second power supply terminal (providing the low-level signal VGL). A gate electrode of the second transistor T2 is connected to a gate electrode of the third transistor T3 to obtain the reset control signal terminal RST. As shown in FIG. 7, the reset control signal terminal RST is connected to the output terminal Oup of the GOA unit of the next stage (that is the (n+1)th stage) to receive the gate scan signal G(n+1) provided by the output terminal Oup of the GOA unit of the next stage (that is the (n+1)th stage) and use used as an output pull-down control signal (that is a reset control signal). The first electrode of the second transistor T2 is connected to the second electrode of the first transistor T1, so the second transistor T2 can be turned on under the control of the pull-down control signal, thereby resetting the GOA unit of the nth stage, that is, in the case where the GOA unit of the nth stage does not need to output the gate scan signal G(n), the output signal provided by the output terminal Oup of the GOA unit of the nth stage is pulled down to the low-level signal VGL. As shown in FIG. 7, the reset control signal terminal RST of the GOA unit of the (n+1)th stage receives the gate scan signal G(n+2) provided by the output terminal of the GOA unit of the (n+2)th stage.

As shown in FIG. 7, the first electrode of the third transistor T3 is further connected to the pull-up node PU, thereby being electrically connected to the second electrode of the fourth transistor T4 and the gate electrode of the first transistor T1. The second electrode of the third transistor T3 is connected to the low-level signal VGL. The gate electrode of the third transistor T3 is connected to the output terminal Oup of the GOA unit of the next stage (that is the (n+1)th stage) to receive the gate scan signal G(n+1) as a pull-down control signal (that is a reset control signal), so that the third transistor T3 can be turned on under the control of the reset control signal to reset the pull-up node PU to the low-level signal VGL, thereby turning off the first transistor T1.

A first electrode of the fourth transistor T4 is connected to a gate electrode of the fourth transistor T4 to obtain the signal input terminal InP of the GOA unit. The signal input terminal InP is connected to the output terminal Oup of GOA unit of the previous-stage (that is the (n−1)th stage) to receive the gate scan signal G(n−1) provided by the output terminal Oup of the GOA unit of the previous-stage as an input signal (and an input control signal). The second electrode of the fourth transistor T4 is connected to a pull-up node PU, so that the pull-up node PU can be charged when the fourth transistor T4 is turned on, so that the voltage of the pull-up node PU can turn on the first transistor T1, and thus the clock signal CLK is output through the output terminal Oup of the GOA unit.

One end of the first capacitor C1 is connected to the gate electrode of the first transistor T1 (that is the pull-up node PU), and the other end is connected to the second electrode of the first transistor T1, so that the level of the pull-up node PU can be stored, and the level of the pull-up node PU can be continuously pulled up by its own bootstrap effect in the case where the first transistor T1 is turned on, so as to improve the output performance.

For example, the semiconductor matrix material included in the inorganic nonmetal trace is the same as the semiconductor matrix material included in the first transistor T1 to the fourth transistor T4 (for example, they are indium gallium zinc oxide).

It should be noted that other components of the motherboard (for example, a control device, an image data encoding/decoding device, a clock circuit, etc.) can use applicable components, which should be understood by those of ordinary skill in the art, and will not be described in detail here, nor should it be taken as a limitation to the present disclosure.

At least one embodiment of the present disclosure provides a manufacturing method of a motherboard, the manufacturing method including: forming a plurality of test terminals, an electrostatic discharge line, a plurality of resistors and a thin film transistor. The plurality of test terminals are electrically connected to the electrostatic discharge line through the plurality of resistors respectively. At least one of the plurality of resistors includes an inorganic nonmetal trace, and the thin film transistor includes an active layer; and the same semiconductor matrix material is used to form the inorganic nonmetal trace and the active layer.

The manufacturing method of the resistors and the thin film transistor will be exemplarily explained with reference to FIGS. 8A-8D.

For example, forming the plurality of resistors and the thin film transistor includes the following steps S101-S103.

Figure 8A:
FIGS. 8A-8D show a manufacturing method of a resistor and a thin film transistor provided by at least one embodiment of the present disclosure.

Step S101: forming a semiconductor matrix material layer 181 (see FIG. 8A). For example, the semiconductor matrix material layer 181 may be made of an oxide semiconductor material or a polysilicon material. For example, the oxide semiconductor material is indium gallium zinc oxide (IGZO).

Figure 8B:
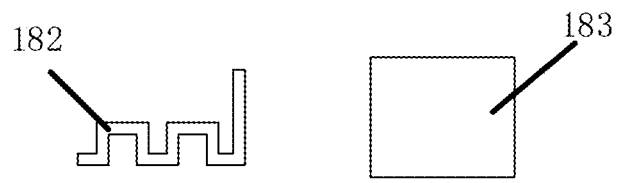

Step S102: patterning the semiconductor matrix material layer 181 to form a first pattern 182 and a second pattern 183. For example, examples of the first pattern 182 and the second pattern 183 are shown in FIG. 8B. For example, the method of patterning the semiconductor matrix material layer 181 can refer to related technologies, and will not be described in detail here.

Step S103: conductor-processing the first pattern 182 (see FIG. 8D) to form the inorganic nonmetal trace 120. For example, the conductor-processing includes at least one selected from the group consisting of doping and plasma processing.

Figure 8C:
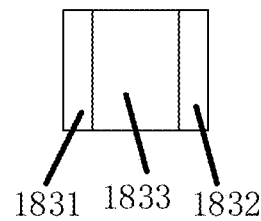
Figure 8D:
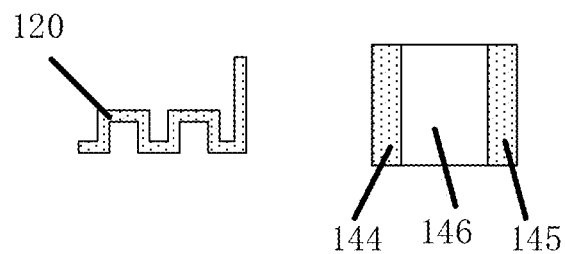

For example, as shown in FIG. 8C, the second pattern 183 includes a first area 1831, a second area 1832, and a third area 1833 located between the first area 1831 and the second area 1832. While conductor-processing the first pattern 182, the manufacturing method further includes: conductor-processing the first area 1831 and the second area 1832 to respectively form the source region 144 of the active layer and the drain region 145 of the active layer. For example, when conductor-processing, the third area 1833 is shielded, so the third area 1833 is not conductor-processed to form the channel region 146 of the active layer.

For example, the electrical conductivity of inorganic nonmetallic traces can be better controlled without increasing the process complexity by conductor-processing the semiconductor matrix material (which is the same as the inorganic nonmetallic trace and the active layer of the thin film transistor of at least one selected from the group consisting of the gate drive circuit and the pixel drive circuit), thus improving the design freedom while improving the free-defect ratio of the motherboard.

Although detailed description has been given above to the present disclosure with general description and embodiments, it shall be apparent to those skilled in the art that some modifications or improvements may be made on the basis of the embodiments of the present disclosure. Therefore, all the modifications or improvements made without departing from the spirit of the present disclosure shall all fall within the scope of protection of the present disclosure.

What is described above is related to the illustrative embodiments of the present disclosure only and not limitative to the scope of the present disclosure; the scopes of the present disclosure are defined by the accompanying claims.

What is claimed is:

1. A motherboard, comprising: at least one display area, a periphery area surrounding the at least one display area, a plurality of test terminals, an electrostatic discharge line, a plurality of resistors, and at least one thin film transistor;
    wherein the plurality of test terminals, the electrostatic discharge line and the plurality of resistors are located in the periphery area;
    the at least one thin film transistor is located in at least one selected from the group consisting of the at least one display area and the periphery area;
    the plurality of test terminals are electrically connected to the electrostatic discharge line through the plurality of resistors respectively;
    at least one of the plurality of resistors comprises an inorganic nonmetal trace;
    the at least one thin film transistor comprises an active layer;
    the inorganic nonmetal trace comprise a same semiconductor matrix material as the active layer of the at least one thin film transistor,
    wherein the plurality of test terminals are sequentially arranged in a first direction, and the plurality of resistors are sequentially arranged in the first direction; and the test terminals and the resistors are alternately arranged in the first direction,
    wherein the inorganic nonmetal trace comprises a fold-line trace, a first end of the fold-line trace is electrically connected to a corresponding one of the plurality of test terminals, and a second end of the fold-line trace is electrically connected to the electrostatic discharge line,
    wherein at least one fold-line trace is between adjacent two test terminals of the plurality of test terminals in the first direction.

2. The motherboard according to claim 1, wherein the semiconductor matrix material comprises an oxide semiconductor material.

3. The motherboard according to claim 2, wherein the oxide semiconductor material comprises indium gallium zinc oxide.

4. The motherboard according to claim 1, wherein the active layer comprises a source region, a drain region and a channel region, and the channel region is located between the source region and the drain region;
    an electrical conductivity of the inorganic nonmetal trace is higher than an electrical conductivity of the channel region; and
    the electrical conductivity of the inorganic nonmetal trace is less than or equal to an electrical conductivity of the source region and an electrical conductivity of the drain region.

5. The motherboard according to claim 4, wherein the inorganic nonmetal trace contains doping impurity, and the source region and the drain region contain the doping impurity; and
   a concentration of the doping impurity in the inorganic nonmetal trace is less than or equal to a concentration of the doping impurity in the source region and a concentration of the doping impurity in the drain region.

6. The motherboard according to claim 5, wherein the channel region does not contain the doping impurity.

7. The motherboard according to claim 1, wherein the fold-line trace comprises a plurality of first fold-line units sequentially arranged in the first direction and connected to each other.

8. The motherboard according to claim 7, wherein at least one of the plurality of first fold-line units comprises a first line segment, a second line segment, a third line segment and a fourth line segment which are sequentially connected in the first direction;
   the first line segment and the third line segment extend along the first direction, and the second line segment and the fourth line segment extend along a second direction crossing the first direction;
   the first line segment and the third line segment are spaced apart in the second direction, and the second line segment and the fourth line segment are spaced apart in the first direction; and
   an end-point of the first line segment is connected to a starting-point of the second line segment, an end-point of the second line segment is connected to a starting-point of the third line segment, and an end-point of the third line segment is connected to a starting-point of the fourth line segment.

9. The motherboard according to claim 1, wherein in a second direction crossing the first direction, the first fold-line unit is located between a straight line where upper edges of the plurality of test terminals are located and a straight line where lower edges of the plurality of test terminals are located.

10. The motherboard according to claim 1, wherein the fold-line trace comprises a rectangular fold-line or a zigzag fold-line.

11. The motherboard according to claim 1, wherein each of the at least one display area comprises a plurality of first signal lines extending side by side to an outside of each of the at least one display area; and
   the plurality of test terminals comprises a first test terminal, and the plurality of first signal lines are electrically connected to the first test terminal.

12. The motherboard according to claim 11, wherein each of the at least one display area further comprises a plurality of second signal lines extending side by side to the outside of each of the at least one display area;
   the plurality of first signal lines cross the plurality of second signal lines;
   the plurality of test terminals further comprise a second test terminal; and
   the plurality of second signal lines are electrically connected to the second test terminal.

13. The motherboard according to claim 11, further comprising a gate drive circuit,
   wherein the gate drive circuit is located in the periphery area and the gate drive circuit comprises a first number of thin film transistors in the at least one thin film transistor; and
   the first number is less than or equal to a number of the at least one thin film transistor.

14. The motherboard according to claim 11, wherein each of the at least one display area further comprises a plurality of sub-pixels arranged in an array;
   each sub-pixel comprises a pixel drive circuit and a light emitting element;
   the pixel drive circuit comprises a second number of thin film transistors in the at least one thin film transistor and the pixel drive circuit is configured to drive the light emitting element; and
   the second number is less than or equal to a number of the at least one thin film transistor.

15. The motherboard according to claim 1, further comprising an insulating layer positioned between the electrostatic discharge line and the plurality of resistors, wherein the insulating layer comprises a plurality of via holes, and, the electrostatic discharge line and the plurality of resistors are respectively electrically connected through the plurality of via holes.

16. A manufacturing method for a motherboard, the motherboard comprising: at least one display area and a periphery area surrounding the at least one display area, the manufacturing method comprising:
   forming a plurality of test terminals, an electrostatic discharge line and a plurality of resistors in the periphery area; and
   forming at least one thin film transistor in at least one of the at least one display region and the periphery area,
   wherein the plurality of test terminals are respectively electrically connected to the electrostatic discharge line through the plurality of resistors;
   at least one of the plurality of resistors comprises an inorganic nonmetal trace;
   the at least one thin film transistor comprises an active layer; and
   using a same semiconductor matrix material to form the trace and the active layer,
   wherein the plurality of test terminals are sequentially arranged in a first direction, and the plurality of resistors are sequentially arranged in the first direction; and
   the test terminals and the resistors are alternately arranged in the first direction,
   wherein the inorganic nonmetal trace comprises a fold-line trace, a first end of the fold-line trace is electrically connected to a corresponding one of the plurality of test terminals, and a second end of the fold-line trace is electrically connected to the electrostatic discharge line,
   wherein at least one fold-line trace is between adjacent two test terminals of the plurality of test terminals in the first direction.

17. The manufacturing method according to claim 16, wherein forming the plurality of resistors in the periphery area and forming the at least one thin film transistor in at least one of the at least one display area and the periphery area comprise:
   forming a semiconductor matrix material layer;
   patterning the semiconductor matrix material layer to form a first pattern and a second pattern;
   conductor-processing the first pattern to form the trace, and the second pattern is used to form the active layer of the at least one thin film transistor.

18. The manufacturing method according to claim 17, wherein the active layer comprises a source region, a drain region and a channel region, the channel region is located between the source region and the drain region; and the manufacturing method further comprises: conductor-processing part of the second pattern to form the source region and the drain region, while not conductor-processing part of the second pattern to form the channel region.

* * * * *